United States Patent [19]
Cooper et al.

[11] Patent Number: 5,430,398
[45] Date of Patent: Jul. 4, 1995

[54] BICMOS BUFFER CIRCUIT

[75] Inventors: Michael D. Cooper, Garland; Robert C. Martin; Stanley C. Keeney, both of Dallas, all of Tex.

[73] Assignee: Texas Instruments Incorporated, Dallas, Tex.

[21] Appl. No.: 176,558

[22] Filed: Jan. 3, 1994

[51] Int. Cl.6 ............................................. H03K 19/20
[52] U.S. Cl. ....................................... 326/110; 326/109
[58] Field of Search ................................ 307/446, 570

[56] References Cited

U.S. PATENT DOCUMENTS

| | | | |
|---|---|---|---|
| 4,902,914 | 2/1990 | Masuoka | 307/446 |
| 5,138,195 | 8/1992 | Satou | 307/446 |
| 5,243,237 | 9/1993 | Khieu | 307/446 |
| 5,254,885 | 10/1993 | Ando | 307/446 |

OTHER PUBLICATIONS

Yano, et al., "Quasi-Complementary BiCMOS for Sub-3-V Digital Circuits", *IEEE Journal of Solid-State Circuits*, vol. 26, No. 11, Nov. 1991, pp. 1708-1719.

*Primary Examiner*—Edward P. Westin
*Assistant Examiner*—Andrew Sanders
*Attorney, Agent, or Firm*—Ronald O. Neerings; James C. Kesterson; Richard L. Donaldson

[57] ABSTRACT

A BiCMOS non-inverting buffer circuit (40) with small fan-in capacitance and excellent bipolar output drive. The circuit is ideal for buffering CMOS logic gates from excessive fan-out loads. The circuit also is less complex and more silicon efficient than present buffer circuit implementations, it provides improved transient saturation charge clamping and one buffer macro in an ASIC library can provide extended drive capability to all CMOS logic gates in the library.

21 Claims, 2 Drawing Sheets

BICMOS BUFFER CIRCUIT

FIELD OF THE INVENTION

The present invention relates to the field of integrated circuit devices.

More specifically, the present invention relates to a BiCMOS Buffer Circuit.

BACKGROUND OF THE INVENTION

The ability to drive large load capacitance while maintaining minimum propagation delay and keeping circuit complexity low is difficult to achieve in sub-micron logic gates operating in the 3.0–3.6 v power supply range.

A CMOS solution to the problem involves increasing output transistor gate widths to obtain good drive capability. But this approach has problems with excessive silicon area use and increased input capacitance which slows the input signal. Use of multiple stages with a 1:3 drive strength ratio reduces input loading but at the expense of silicon area and complexity. A limit to the minimum propagation delay is also set by the number of stages used.

A bipolar approach to solving the problem offers the best drive capability in terms of silicon area required. There are presently three bipolar solutions:

1) BiNMOS. The BiNMOS (2 input NAND gate) circuit 10 of FIG. 1 uses a bipolar transistor 12 to provide good pull up drive capability. Pull down drive, however, is implemented with N-channel CMOS transistors 14, 16, 18 and 20, which has the problems already pointed out for CMOS. BiNMOS also performs a portion of the logic function in the pull down section which leads to stacking of N-channel transistors. This also further reduces pull down drive capability.

2) BiCMOS. The BiCMOS (2 input NAND gate) circuit 22 of FIG. 2 offers good pull up and pull down drive capability with Vcc in the 4.5–5.5 v range. Performance rapidly degrades as Vcc is reduced below 4 volts. At lower supply voltages the gate to source voltage of transistors 24 and 26 is greatly reduced due to the base-emitter voltage of transistor 30. The reduction in drain current results in less drive for transistor 30 which degrades pull down drive.

3) QCBiCMOS. The Quasi-Complementary BiCMOS (2 input NAND gate (QCBiCMOS)) circuit 32 of FIG. 3 has been shown to provide good performance for sub-micron logic gates operating in the 3.0–3.6 volt power supply range. See Ref 1. Yano et al., "Quasi-Complementary BiCMOS for Sub-3-V Digital Circuits," IEEE Journal of Solid State Circuits, vol. 26, no. 11, pp 1708–1719, Nov. 1991. Equations are derived in reference 1 that show QCBiCMOS delay is proportional to $(CLOAD)^{}(\frac{1}{4})$, BiCMOS delay proportional to $(CLOAD)^{}(\frac{1}{2})$, and CMOS delay proportional to $(CLOAD)^{**}(1.00)$. QCBiCMOS clearly has the best performance. QCBiCMOS delay dependence on the power supply voltage is also shown to not be a problem until Vcc approaches 2.0 v.

A problem with QCBiCMOS, as presented in ref. 1 of Yano et al., is circuit complexity. As seen in FIG. 3, individual gates G1 and G2 are used to drive pull up nodes N1 and pull down node N2. Sizing used in gates G1 and G2 provide some performance advantage but at the expense of increased macro complexity. As the macro's logic function complexity increases it becomes clear using individual gates to provide separate drive to pull up and pull down nodes has a silicon area penalty. Another problem with QCBiCMOS is the manner in which the pull down transistor, 36, is turned off. In FIG. 3, feedback inverter G3 signals transistor 38 to turn on and discharge transistor 36 saturation charges when the output reaches a logic low. The problem involves the timing of the feedback signal. If the signal arrives too soon, base drive needed for transistor 36 can be diverted away through transistor 38. The feedback inverter is sized to prevent this from occurring. If the signal is delayed too much, however, and does not arrive before the next pull up transition, a transistor 34–36 short circuit condition can occur. Transistor 36 will still be in an on state while transistor 34 is supplying pull up drive. Providing a properly timed clamp signal that satisfies all possible output loading conditions with the method shown in FIG. 3 is found to be a problem.

SUMMARY OF THE INVENTION

The present invention disclosed herein comprises a BiCMOS non-inverting buffer circuit with small fan-in capacitance and excellent bipolar output drive. The circuit is ideal for buffering CMOS logic gates from excessive fan-out loads. The circuit also is less complex and more silicon efficient than present buffer circuit implementations, it provides improved transient saturation charge clamping and one buffer macro in an ASIC library can provide extended drive capability to all CMOS logic gates in the library.

DETAILED DESCRIPTION OF PREFERRED EMBODIMENTS

Figure 4:
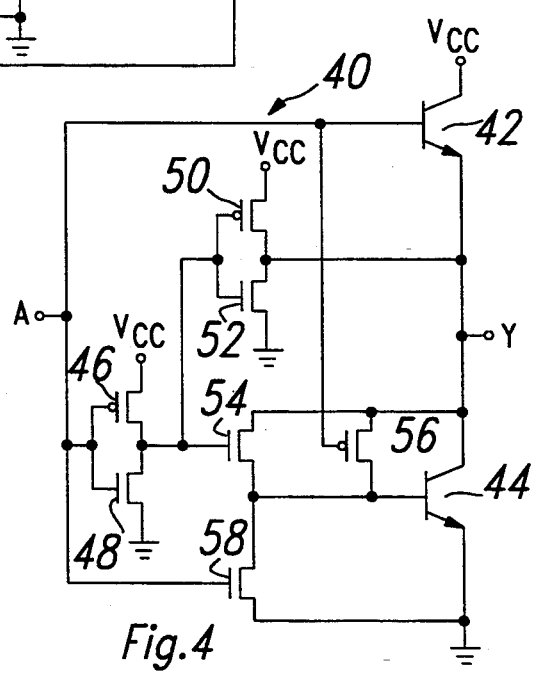
FIG. 4 is a schematic diagram of a BiCMOS buffer circuit according to one embodiment of the invention.

A simple BiCMOS non-inverting buffer circuit 40 with small fan-in capacitance and excellent bipolar output drive is shown in FIG. 4. The circuit is used to buffer CMOS logic gates from excessive loads. Software can be used to detect load conditions determined as excessive and insert the buffer between the CMOS macro and the load that must be driven. When fan-out loads are within the limited drive range of the CMOS macro the buffer is not used. CMOS gates can more efficiently drive small fan out loads due to the small propagation delay in the buffer becoming significant. Only one buffer is required in an ASIC library to provide drive improvement for all CMOS macros in the library. The buffer layout requires minimal silicon area.

With input node A at logic high, bipolar transistor 42 provides excellent drive to pull output node Y to a logic high. Transistor 42 drive turns off when Y reaches a Vbe below Vcc. Node Y is restored to Vcc potential by the inverter comprising transistors 50 and 52, that is at a logic high. Transistor 58 holds the base of transistor 44 at ground potential to ensure transistor 44 collector leakage currents are not present.

With node A at a logic low, P-channel transistor 56 provides base drive to transistor 44. Transistor 56 provides base drive to transistor 44 until the collector voltage (Y) drops below the threshold of transistor 56. Enough carriers are delivered to the base node to drive transistor 44 into shallow saturation where the collector voltage becomes less that the base voltage. Shallow saturation provides a fast pull down below a Vbe and is one of the advantages of the approach used.

Figure 3:
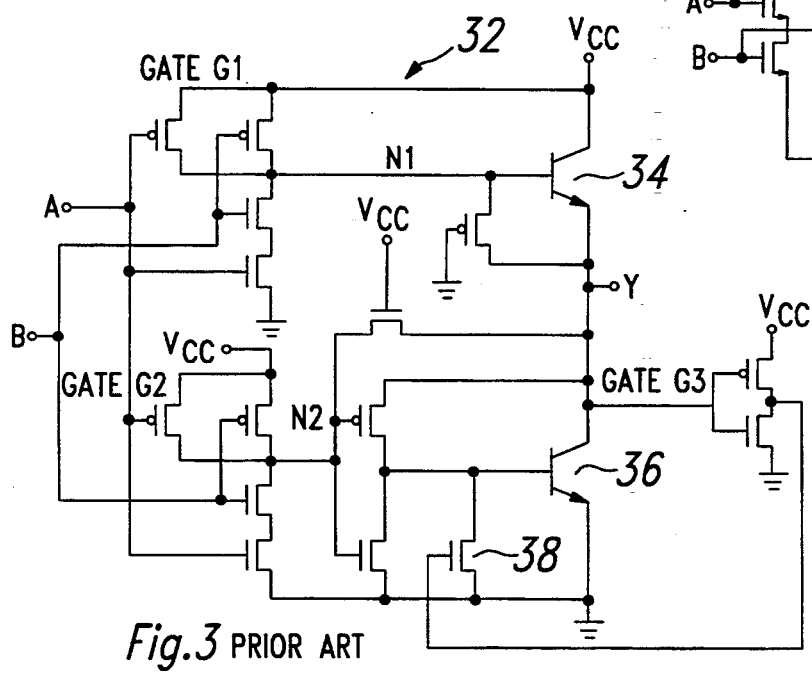
FIG. 3 is a schematic diagram of a prior art QCBiCMOS buffer circuit.

Shallow saturation charges stored in transistor 44's collector-base junction are removed by clamping transistor 54. Transistor 54 turns on while node A is transitioning high to low. Transistor 54 is setup to start clamping transistor 44's collector-base storage charges immediately when transistor 44's collector voltage becomes equal to transistor 44's base voltage. The immediate and automatic action of transistor 54 to start removing saturation charges is an improvement over the sized feedback inverter and base-emitter clamp shown in FIG. 3. Node Y is held at ground potential by the inverter comprising transistors 50 and 52, that is at logic low.

Figure 5:
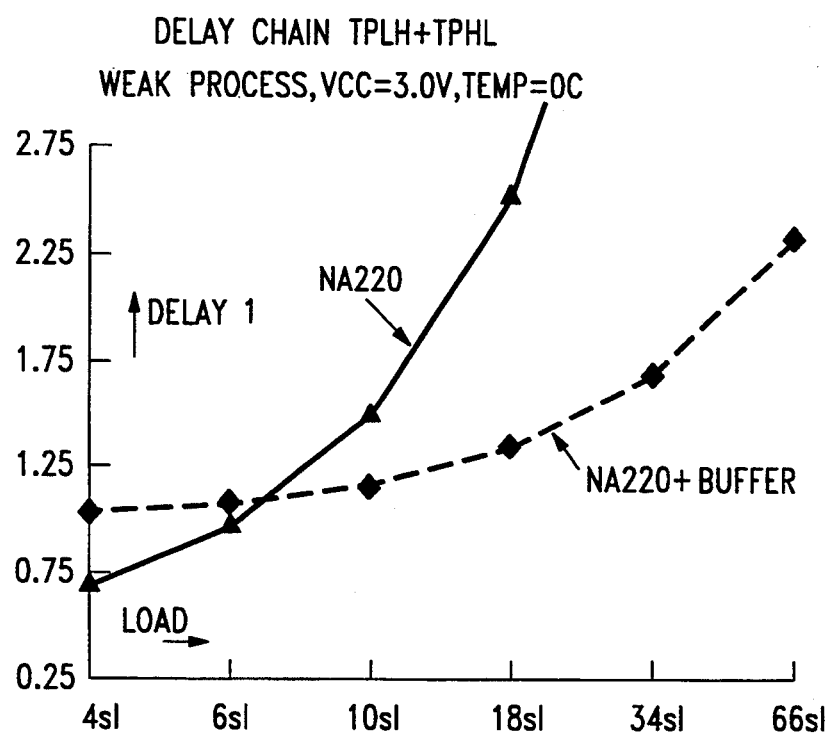
FIG. 5 is a graph showing the excellent capacitive load driving capability of the buffer circuit of FIG. 4.

The graph in FIG. 5 shows the excellent capacitive load driving capability of the buffer. The buffer was connected to the output of a 2 input CMOS nand gate (NA220) to show the performance difference between the NA220/buffer combination driving the load and the CMOS nand gate driving the load directly. It can be seen that above fan-out loads of 6 (6 standard loads, 6 sl) the NA220/buffer combination has a clear drive advantage. This advantage also applies when the buffer is combined with other CMOS gates in an ASIC library. Data for the graph was taken from SPICE3 simulations using the Texas Instruments' EPIC3B process with Vcc=3.0 v and temperature set at 0 C.

The buffer circuit of FIG. 4 offers an area efficient approach to providing excellent output drive for heavily loaded CMOS macros in an ASIC library. Moreover, many past and present ASIC library macros used to drive heavy loads also include logic functions of the CMOS macro. Advantages of the BiCMOS buffer circuit of FIG. 4 include: Less complex and more silicon efficient implementation than present art; improved transient saturation charge clamping; and one buffer macro in an ASIC library can provide extended drive capability to all CMOS logic gates in the library.

While this invention has been described with reference to an illustrative embodiment, this description is not to be construed in a limiting sense. Various modifications to the illustrative embodiment, as well as other embodiments of the invention will be apparent to persons skilled in the art upon reference to this description. It is therefore contemplated that the appended claims will cover any such modifications or embodiments as fall within the true scope of the invention.

What is claimed:

1. A semiconductor device, comprising:
   a BiOMOS buffer circuit coupling an input to an output, said BiCMOS buffer circuit comprising;
   an input of a first inverter, a control terminal of a first transistor and a control terminal of a second transistor, all connected to said input;
   an output of said first inverter connected to an input of a second inverter and to a control terminal of a third transistor;
   a first electrode of said first transistor coupled to receive a first reference voltage;
   a second electrode of said first transistor connected to said output, to an output of said second inverter, to a first electrode of said third transistor, to a first electrode of a fourth transistor and to a first electrode of a fifth transistor;
   a control terminal of said fourth transistor connected to said control terminal of said first transistor, a second electrode of said fourth transistor connected to a second electrode of said third transistor, connected to a first electrode of said second transistor and connected to a control terminal of said fifth transistor; and
   a second electrode of said second transistor connected to a second electrode of said fifth transistor and coupled to receive a second reference voltage.

2. The device of claim 1 in which said first reference voltage is Vcc.

3. The device of claim 1 in which said second reference voltage is ground.

4. The device of claim 1 in which said first reference voltage is Vcc and said second reference voltage is ground.

5. The device of claim 1 in which said first inverter comprises a first transistor and a second transistor, a control terminal of said first transistor and a control terminal of said second transistor connected to said input of said inverter, a first electrode of said first transistor coupled to receive said first reference voltage, a first electrode of said second transistor coupled to receive said second reference voltage, and a second electrode of said first transistor and an electrode of said second transistor connected to said output of said inverter.

6. The device of claim 1 in which said second inverter comprises a first transistor and a second transistor, a control terminal of said first transistor and a control terminal of said second transistor connected to said input of said inverter, a first electrode of said first transistor coupled to receive said first reference voltage, a first electrode of said second transistor coupled to receive said second reference voltage, and a second electrode of said first transistor and an electrode of said second transistor connected to said output of said inverter.

7. The device of claim 1 in which said first inverter comprises a first transistor and a second transistor, a control terminal of said first transistor and a control terminal of said second transistor connected to said input of said inverter, a first electrode of said first transistor coupled to receive said first reference voltage, a first electrode of said second transistor coupled to receive said second reference voltage, a second electrode of said first transistor and an electrode of said second transistor connected to said output of said inverter, and said second inverter comprises a third transistor and a fourth transistor, a control terminal of said third transistor and a control terminal of said fourth transistor connected to said input of said inverter, a first electrode of said third transistor coupled to receive said first reference voltage, a first electrode of said fourth transistor coupled to receive said second reference voltage, and a second electrode of said third transistor and an electrode of said fourth transistor connected to said output of said inverter.

8. The device of claim 1 in which said first and fifth transistors are bipolar transistors.

9. The device of claim 8 in which said first electrodes, control terminals, and second electrodes of said first and fifth transistors are collectors, bases and emitters, respectively.

10. The device of claim 1 in which said second and third transistors are n-channel transistors and said fourth transistor is a p-channel transistor.

11. The device of claim 5 in which said first and second transistors of said first inverter are p-channel and n-channel transistors, respectively.

12. The device of claim 6 in which said first and second transistors of said second inverter are p-channel and n-channel transistors, respectively.

13. A circuit, comprising:
   a first inverter for inverting a logic level present on an input signal conductor and for outputting a logic level opposite said logic level present on the input signal conductor to an output of said first inverter:
   a second inverter for inverting a logic level present on said output of said first inverter and for outputting a logic level opposite said logic level present on the output of said first inverter to an output signal conductor;
   a first bipolar transistor for controlling current flow between a first supply voltage and said output signal conductor, a control electrode of said first bipolar transistor being coupled to said input signal conductor;
   a second bipolar transistor for controlling current flow between said output signal conductor and a second supply voltage, a control electrode of said second bipolar transistor being coupled to a first electrode of a first MOS transistor, a first electrode of a second MOS transistor, and a first electrode of a third MOS transistor;
   a second electrode of said first MOS transistor coupled to said output signal conductor and to a second electrode of said second MOS transistor, a control electrode of said second MOS transistor coupled to said output of said first inverter, a control electrode of said third MOS transistor coupled to said input signal conductor, and a second electrode of said third MOS transistor coupled to said output signal conductor.

14. A semiconductor device, comprising:
   an input;
   an output;
   an input of a first inverter, a control terminal of a first transistor and a control terminal of a second transistor, all connected to said input;
   an output of said first inverter connected to an input of a second inverter and to a control terminal of a third transistor;
   a first electrode of said first transistor coupled to receive a first reference voltage;
   a second electrode of said first transistor connected to said output, to an output of said second inverter, to a first electrode of said third transistor, to a first electrode of a fourth transistor and to a first electrode of a fifth transistor;
   a control terminal of said fourth transistor connected to said control terminal of said first transistor, a second electrode of said fourth transistor connected to a second electrode of said third transistor, connected to a first electrode of said second transistor and connected to a control terminal of said fifth transistor; and
   a second electrode of said second transistor connected to a second electrode of said fifth transistor and coupled to receive a second reference voltage.

15. The device of claim 14 in which said first inverter comprises a first transistor and a second transistor, a control terminal of said first transistor and a control terminal of said second transistor connected to said input of said inverter, a first electrode of said first transistor coupled to receive said first reference voltage, a first electrode of said second transistor coupled to receive said second reference voltage, and a second electrode of said first transistor and an electrode of said second transistor connected to said output of said inverter.

16. The device of claim 14 in which said second inverter comprises a first transistor and a second transistor, a control terminal of said first transistor and a control terminal of said second transistor connected to said input of said inverter, a first electrode of said first transistor coupled to receive said first reference voltage, a first electrode of said second transistor coupled to receive said second reference voltage, and a second electrode of said first transistor and an electrode of said second transistor connected to said output of said inverter.

17. The circuit of claim 13 in which said first inverter comprises a first transistor and a second transistor, a control terminal of said first transistor and a control terminal of said second transistor connected to an input of said inverter, a first electrode of said first transistor coupled to receive said first supply voltage, a first electrode of said second transistor coupled to receive said second supply voltage, and a second electrode of said first transistor and a second electrode of said second transistor connected to said output of said inverter.

18. The circuit of claim 13 in which said second inverter comprises a first transistor and a second transistor, a control terminal of said first transistor and a control terminal of said second transistor connected to said input of said inverter, a first electrode of said first transistor coupled to receive said first supply voltage, a first electrode of said second transistor coupled to receive said second supply voltage, and a second electrode of said first transistor and a second electrode of said second transistor connected to said output of said inverter.

19. The circuit of claim 13 in which said first supply voltage is VCC and said second supply voltage is ground.

20. The circuit of claim 17 in which said first transistor is a p-channel MOS transistor and said second transistor is an n-channel MOS transistor.

21. The circuit of claim 18 in which said first transistor is a p-channel MOS transistor and said second transistor is an n-channel MOS transistor.

* * * * *

UNITED STATES PATENT AND TRADEMARK OFFICE
CERTIFICATE OF CORRECTION

Figure 1:
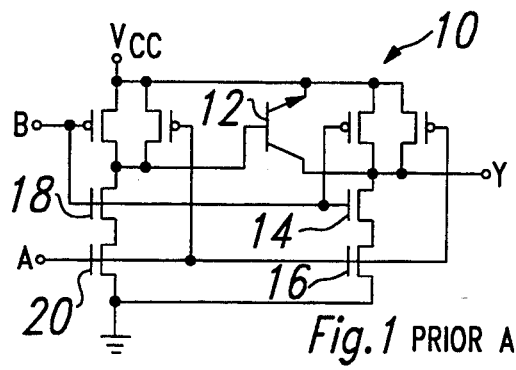
FIG. 1 is a schematic diagram of a prior art BiNMOS buffer circuit.
Figure 2:
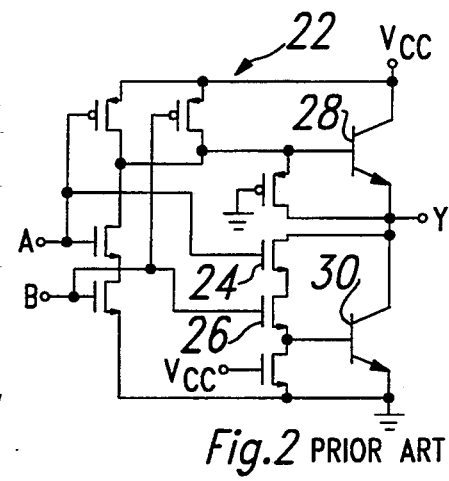
FIG. 2 is a schematic diagram of a prior art BiCMOS buffer circuit.

PATENT NO. : 5,430,398
DATED : Jul. 4, 1995
INVENTOR(S) : Michael D. Cooper, Robert C. Martin, Stanley C. Keeney It is certified that error appears in the above-indentified patent and that said Letters Patent is hereby corrected as shown below:

Drawings:

Figure 1 - reverse the emitter and collector of transistor 12.

Column 3, line 9, change "that" to -- than --.

Claim 1, line 2, change "BiOMOS" to -- BiCMOS --.

Signed and Sealed this

Third Day of June, 1997

Attest:

BRUCE LEHMAN

Attesting Officer        Commissioner of Patents and Trademarks